United States Patent [19]

Watanabe et al.

[11] 4,043,748
[45] Aug. 23, 1977

[54] EVAPORATION BOATS FOR USE IN VAPOR DEPOSITION

[75] Inventors: Kiyoshi Watanabe; Kazuo Sunahara, both of Mobara; Motoyasu Terao, Tokyo; Tsutomu Fujita, Mobara, all of Japan

[73] Assignee: Hitachi, Ltd., Tokyo, Japan

[21] Appl. No.: 715,716

[22] Filed: Aug. 19, 1976

[30] Foreign Application Priority Data

Dec. 12, 1975 Japan .................................. 50-150560

[51] Int. Cl.² ............................................. F27B 21/04
[52] U.S. Cl. ................................... 432/253; 432/263; 266/275; 118/48
[58] Field of Search ................. 432/253, 156, 262–265, 432/239, 5, 6; 23/273 SP; 266/200, 205, 275; 164/134, 135; 156/609, 616 A; 118/48, 49.5; 206/84

[56] References Cited

U.S. PATENT DOCUMENTS

| 454,759 | 6/1891 | Oden | 432/262 |
|---|---|---|---|
| 3,452,970 | 7/1969 | Mayer et al. | 432/265 |
| 3,746,502 | 7/1973 | Erhart et al. | 432/263 |
| 3,984,088 | 10/1976 | Sommerkamp | 266/275 |

Primary Examiner—John J. Camby
Assistant Examiner—Henry C. Yuen
Attorney, Agent, or Firm—Charles E. Pfund

[57] ABSTRACT

The evaporation boat comprises superposed upper and lower sheets. The upper sheet includes a upwardly convexed central section and a pair of side sections bent back toward the central section and the lower sheet includes a downwardly convexed central section and a pair of side sections bent inwardly toward the upper sheet. The upper and lower sheets are superposed each other such that the central sections of the upper and lower sheets define a substantially closed chamber for accomodating source material to be evaporated, that slit shaped vapor passages are formed between the upper and lower sheets or the opposite sides of the chamber and that any straight line drawn between any point on the surface of the source material and any point in the passages intersects the inner wall of the upper or lower sheets.

8 Claims, 9 Drawing Figures

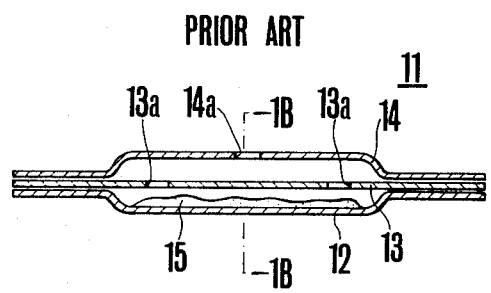
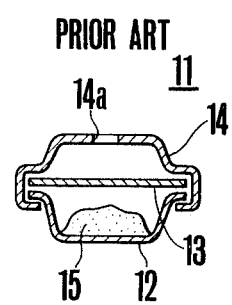
FIG. 1A PRIOR ART
FIG. 1B PRIOR ART
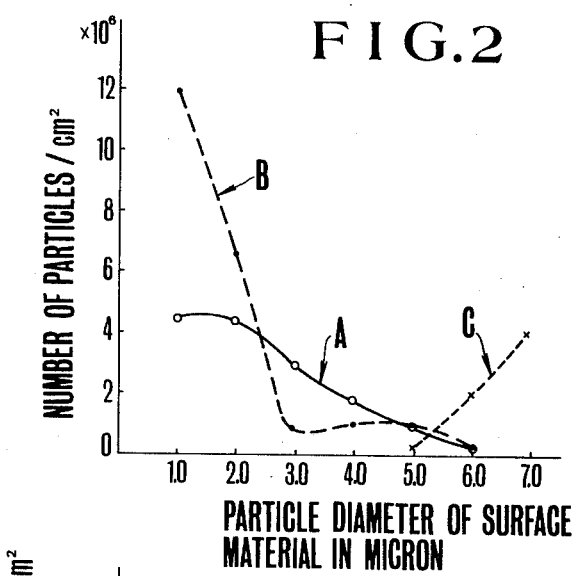
FIG. 2
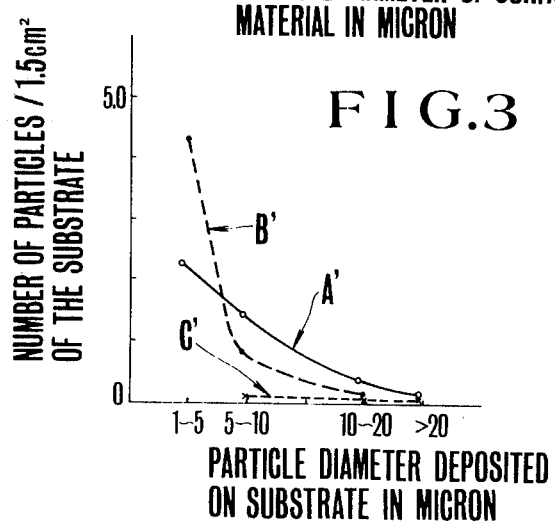
FIG. 3

EVAPORATION BOATS FOR USE IN VAPOR DEPOSITION

BACKGROUND OF THE INVENTION

This invention relates to an evaporation boat, and more particularly to an evaporation boat for evaporating material to form a thin film of the material on a substrate by vacuum deposition technique wherein there is a tendency of depositing particles larger than 1 micron.

Vacuum deposition technique, for example, is used to form a photoconductive film, optical stripe filters, dichroic mirrors or the like which constitute a tanget for a pick up tube.

As the evaporation sources for vacuum deposition are used a crucible, coil or boat depending upon the field of application. Among these various types of the evaporation source, evaporation boats are used most widely because of its cheapness and easiness in handling. Most of the boats have a simple construction utilizing a thin sheet made of a metal having a high melting point, tungsten, molybdenum and tantalum, for example, and provided with a recess. The longitudinal opposite ends of the boat are connected to an electric source to heat and evaporate vapourizable material contained in the recess.

With a boat of such simple construction when the material to be evaporated comprises a sublimatable material, solid particles having a diameter of several microns also formed together with the vapour of the material.

When such solid particles having a diameter of larger than 1 micron are contained in the vapour deposited films, the quality thereof would be greatly degraded. For example, the light receiving area of SATICON tube (trade mark) is 12.7 mm × 9.5 mm for a tube diameter of 1 inch, and 8.8 mm × 6.5 mm for a tube diameter of ⅔ inch. In an image monitor, an enlarged image, for example 14 × 21 inches, is formed on an image receiving tube. Accordingly, should the photoconductive film of an image pick up tube contain massive foreign matters, picture defects in the form of dark spots or bright spots, reproduced on the screen of an image receiving tube, would be formed thus greatly degrading the quality of the picture.

To eliminate this defect, a so-called laminated type evaporation boat as shown in FIG. 1 has been proposed. As shown in FIGS. 1A and 1B, the boat 11 comprises upper and lower recessed sheets 14 and 12 and an intermediate partition sheet 13. The intermediate partition sheet 13 is provided with two spaced perforations 13a while the upper sheet a single perforation 14a at a point intermediate of said perforations 13a. The material to be evaporated 15 is contained in the recess of the lower sheet 13. When current is passed through the boat by connecting it across a source of supply the material 15 is evaporated by the heat of the boat and the vapour of the material is ejected through tortuous passages including perforations 13a and 14a. Solid particles having a diameter larger than 1 micron are removed by the collision thereof against the inner wall of the upper sheet 14.

With this laminated type evaporation boat as the vapour much pass twice through perforations thus decreasing the vapour deposition speed. In addition, this construction requires higher temperature for the boat.

SUMMARY OF THE INVENTION

Accordingly, it is an object of this invention to provide an improved evaporation boat that can prevent solid massive matters from depositing onto the surface of a substrate.

Another object of this invention is to provide an improved evaporation boat capable of preventing solid massive matters from depositing onto the substrate without any appreciable decrease in the vapour deposition speed.

According to this invention these and further objects can be accomplished by providing an evaporation boat comprising superposed upper and lower sheets, the upper sheet having a upwardly convexed central section and a pair of side sections connected to the transverse opposite ends of the central section and bent back toward the central section, the lower sheet having a downwardly convexed central section and a pair of side sections connected to the transverse opposite ends of the downwardly convexed central section and bent inwardly toward the upper sheet, and the upper and lower sheets being superposed each other such that the central sections of the upper and lower sheets define a substantially closed chamber for accomodating source material to be evaporated, that slit shaped vapour passages are formed between the upper and lower sheets on the opposite sides of the chamber and that any stright line drawn between any point on the upper surface of the source material contained in the chamber and any point in the passages intersects the inner wall of the upper or lower sheet.

According to a modified embodiment flat intermediate sections are interposed between the opposite ends of the central section and the bent back side sections of the upper sheet for forming relatively long slit shaped vapour passages.

According to another modification the slit shaped vapour passages are made to be tortuous for more accurating presenting escape of particles.

BRIEF DESCRIPTION OF THE DRAWINGS

The invention can be more fully understood from the following detailed description taken in conjunction with the accompanying drawings in which:

FIG. 1A is a longitudinal sectional view showing one example of a prior art evaporation boat;

FIG. 1B is a cross-sectional view taken along a line 1B—1B shown in FIG. 1A;

FIG. 2 is a graph showing a primary particle diameter distribution of each lot of the evaporation sources;

FIG. 3 is a graph showing the relationship between the number of the particles deposited on the surface of a substrate and the particle diameter;

DESCRIPTION OF THE PREFERRED EMBODIMENTS

To have a better understanding of this invention, the behaviour of extremely small particles contained in metal vapour will firstly be considered. In the case of a sublimating material, the material evaporates before melting so that the primary particles comprising a powder or a sintered mass utilized as the evaporation source fly or the peripheral portions of the primary particles sublimate with the result that particles having smaller diameters than the primary particles will fly. Such flying is caused by the fact that the solid particles are blown upwardly by the molecular vapour of the material and such flying particles deposit on the surface of a substrate at a certain probability thus forming a defective vapour deposited film, where deposited particles hereinafter refer to as "substrate deposit particles".

When vapour depositing a sublimating material, different from non-sublimating material wherein larger secondary particles are formed by the progress of sintering or fusing of the primary particles during heating, the sublimating material begins to sublimate by the radiation heat from the boat, whereby the bondings between the primary particles are broken.

This fact was clarified by the following experiment.

That is, in the experiment three lots of different types of cerium oxide powder having different particle diameters were used as an evaporation source. FIG. 2 is a graph showing a primary particle diameter distribution of each lot of the above evaporation sources.

In FIG. 2, curves A and B show commercial cerium oxide lots, which curve C a specially prepared cerium oxide lot in which primary particles having diameters of smaller than 5 microns were removed by sintering and classification. In this experiment, a powder of cerium oxide was placed in a V type molybdenum boat under a vacuum of lower than $5 \times 10^{-5}$ torr, the deposition speed of the cerium oxide vapour to the surface of the substrate was limited to 0.4 Angstrom/sec. and the substrate was spaced 30 cm from the boat thus forming a cerium oxide film having a thickness of 1000A.

FIG. 3 is a graph showing the relationship between the number of the particles deposited on a unit area of the substrate and the particle diameter when materials corresponding to curves A, B and C were vapour deposited. As shown, curves A' and B' are generally similar to curves A and B shown in FIG. 2, but curve C' is not similar to curve C showing that the deposition of substrate deposit particles having particle diameters less than 5 microns was prevented.

Figure 4:
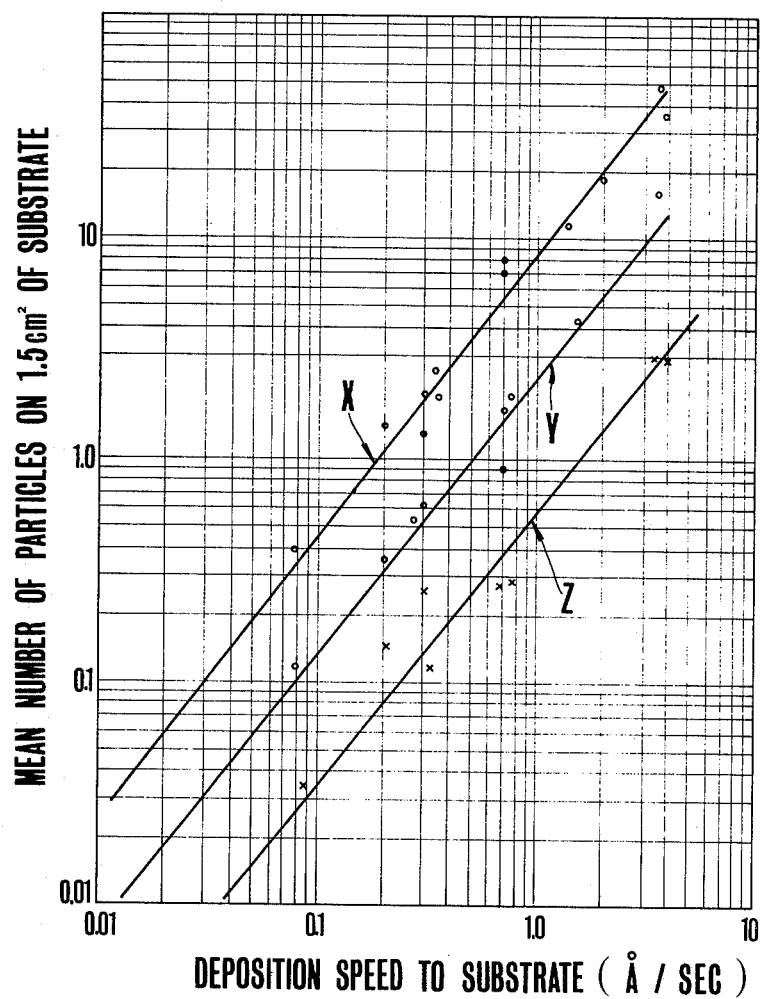
FIG. 4 is a graph showing the relationship between the deposition speed to the substrate and the number of particles deposited on the surface of the substrate.

From this it was concluded that the fly of the primary particles is probably caused by the energy exchange between the vapour and the particles by the collision of the primary particles during flying. The same conclusion can also be made from a graph shown in FIG. 4 showing the relationship between the average number of particles depositing on a unit area of the substrate and the deposition speed which is expressed in terms the amount of energy of the vapour molecules. More particularly, in FIG. 4, a straight line X depicted on a logarithmic section paper represents the number of particles deposited on the substrate and having a particle diameter of from 1 to 5 microns. The straight line Y shows the number of the deposited particles having a diameter of from 5 to 10 microns, whereas straight line Z the number of the deposited particles having a diameter of larger than 10 microns. FIG. 4 shows that particles having a small imparted energy are difficult to fly and that large particles are also difficult to fly, thus showing the manner of flying of the primary particles.

This invention utilizes such flying behaviour of the particles, and the objects of the invention can be accomplished when the following conditions are satisfied.

Firstly, it is necessary to remove minute primary particles in the boat since they are always contained in the evaporation source material. In other words, it is necessary to sinter and fuse together minute particles in the boat thereby forming harmless larger particles. To this end, it is necessary to totally close the boat.

Secondly, as the primary particles tend to fly out from the surfaces of the evaporation source material it is necessary to make the temperature of the surface of the source material to be equal or slightly higher than the maximum temperature of the source material to cause the surface particles to sinter or fuse at an earlier time than the particles at other portions. To this end, it is necessary to make the temperature of the wall of the boat in contact with the source material to be the same or higher than the temperature of the other portions of the boat. To this end, the boat must be of a closed type having a higher wall temperature wherein the boat is surrounded by the heat generating units made of the same material and having the same dimension, or surrounded by heat generating units made of different materials or having different dimensions.

Thirdly, where a closed type boat is used it is necessary to prevent a large decrease in the deposition speed. To this end, it is necessary to narrow the vapour exit opening of the boat by forming a narrow and long slit.

Fourthly, it is necessary to construct the boat such that flying particles come to collide one or more against the wall of the boat thus loosing their kinetic energy, or that the particles are prevented from flying toward the substrate.

To accomplish this object the boat much be constructed such that the exit opening is not formed along any straight lines interconnecting respective points on the surface of the source material and the substrate, or that a deep vertical slit is formed. With such a slit as there is no vapour in the slit at the time of starting the heating, no heat energy is imparted to the vapour so that the wall of the slit assume higher temperature than the other portions of the boat. Accordingly, the vapour of the source material does not deposit on the wall of the slit. Even when deposition occurs, the deposited material will evaporate at once and force back the vapour approaching the slit. Due to repeated reevaporation and forcing back at the slit the size of the flying particles is greatly decreased. Moreover, as no particle is formed at the time of reevaporation, substantially no particle can pass through the slit. No material was deposited on the wall of the slit after a vapour deposition operation.

Fifthly, the exit opening should be shaped such that it guides the molecular vapour of the source material toward the substrate when the vapour comes to the outside of the boat through the exit opening.

Sixthly, the boat should comprise upper and lower units. This construction assures easy loading of the source material into the boat as well as easy fabrication of the boat.

The following examples of the boat were constructed to satisfy the conditions described above.

EXAMPLE 1

Figure 5:
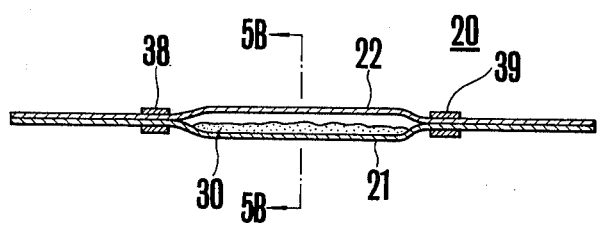
FIG. 5A is a longitudinal sectional view of one embodiment of the evaporation boat constructed according to the teaching of this invention.
FIG. 5B is a cross-sectional view taken along a line 5B—5B in FIG. 5A.
Figure 5:
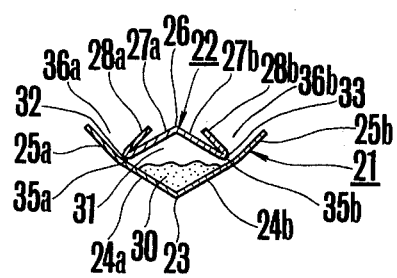

In the example shown in FIGS. 5A and 5B the boat generatly designated by a reference numeral numeral 20 comprises a upper sheet 22 and a lower sheet 21 having the same dimension and manufactured by the same heat generating material. As shown in FIG. 5B, the cross-section at the central portion of the lower sheet 21 has a V shape which is downwardly convexed. The transverse opposite sides of the sheet are bent upwardly in symmetric relation with respect to the bottom or heel 23 of the recess. The upper portions 25a and 25b of the sides 24a and 25a of the sheet are bent inwardly.

The sides 27a and 27b of the central portion of the upper sheet 22 is also bent to form an inverted V above the recess of the lower sheet 21, the heel 26 of the recess of the upper sheet vertically aligning with the heel 23 of the lower recess. The upper sheet 22 with both sides bent comprises a lid for the lower recess. Portions 28a and 28b on the outside of the sides 27a and 27b are bent back toward the sides. The recessed upper and lower sheets 22 and 21 define a chamber 31 for loading the evaporation source material 30. The upper and lower sheets are overlapped to form slits 35a and 35b of a definite width between the bends 32 and 33 of the upper sheet and the lower sheet. The bent portions 28a and 28b of the upper sheet and the inwardly bent portions 25a and 25b of the lower sheet 21 cooperate to form V shaped vapour ejection openings 36a and 36b. It is to be noted that any straight line between any points on the surface of the source material 30 charged in the evaporation chamber 31 and any point in the slits 35a and 35b intersects the inner surface of the upper sheet 22 or the inner surface of the lower sheet 21. The opposite ends of the upper and lower sheets 22 and 21 are united into integral extensions as shown in FIG. 5A and the extensions are damped by annular metal bands 38 and 39 made of molybdenum, for example.

A powder of cerium oxide having a characteristic as shown by B of FIG. 2 was loaded in the boat, and electrically heated at under a vacuum of lower than $5 \times 10^{-5}$ torr to form a vapour deposited film having a thickness of 1000A. The film was compared with a film prepared without using the upper sheet 22 and obtained the result as shown in the following table 1.

Table 1

| Type of the boat | Number of particles on the substrate having an average particle Size of 1 to 5μ* | Percentage of good substrate | Number of particles in the boat having a dia. of 1 to 5 μ |
|---|---|---|---|
| example 1 | 0.5/substrate | 80 % | $\leq 2.0 \times 10^4/cm^2$ |
| no upper sheet | 5.0/substrate | 20 % | $1.2 \times 10^7/cm^2$ |

*Mean value obtained by measuring one hundred substrates each having 1.5 cm² area As can be noted from Table 1, according to this invention, since the number of the particles in the boat is reduced greatly, the number of the particles deposited on the substrate is also reduced by one order of magnitude with the result that the quality of the deposited film is improved greatly.

This is caused by the face that nearly all particles contained in the vapour in the boat are arrested by the inner surface of the upper sheet 16 and particles that have escaped through the slits 35a and 35b are arrested by the inwardly bent portions 25a and 25b.

Consequently, only the vapour of the source material can reach the substrate.

EXAMPLE 2

Figure 6:
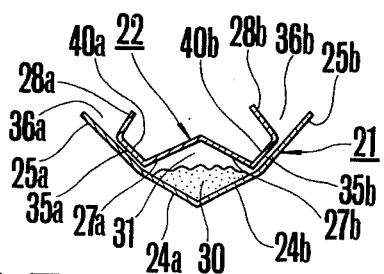
FIGS. 6 and 7 are cross-sectional views showing modified embodiments of this invention.

FIG. 6 shows a second embodiment of this invention in which portions corresponding to those shown in FIGS. 5A and 5B are designated by the same reference numerals. In this embodiment, between sections 27a and 28a and between sections 27b and 28b of the upper sheet 22 are interposed flat sections 40a and 40b which are paralled with sections 25a and 25b of the lower sheet 21 to form narrow slits 35a and 35b therebetween. Since these slits present substantial resistance to the vapour passing through the slits, the pressure in the loading chamber 31 is increased thereby enhancing the sintering or fusing of the source material 30. As a result, discharge of the particles through the slit is decreased.

EXAMPLE 3

Figure 7:
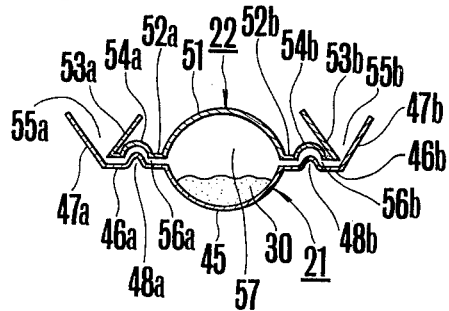

FIG. 7 shows still further modification of this invention wherein the lower sheet 21 is formed with a semicircular bottom 45 at its center, horizontal sections 46a and 46b on the opposite sides of the bottom 45, and bent up sections 47a and 47b on the opposite ends of the horizontal sections 46a and 46b. Ribs 48a and 48b are formed at substantially the centers of respective horizontal sections 46a and 46b. The upper sheet 21 is formed with semicircular central section 51 confronting the semicircular bottom 45 of the lower sheet 21, horizontal sections 52a and 52b facing the horizontal sections 46a and 46b of the lower sheet and bent back sections 53a and 53b on the opposite ends of the horizontal sections 52a and 52b. The horizontal sections 52a and 52b, and 46a and 46b are spaced a predetermined distance and provided with longitudinal ribs 54a, 54b, 48a and 48b respectively which are also spaced each other. Accordingly, relatively long slit like vapour passages 56a and 56b are formed between the loading chamber 57 and V shaped ejecting ports 55a and 55b.

In this embodiment, in as much as the passages 56a and 56b are tortuous they are effective to increase the pressure in the loading chamber 57. Any straight line drawn between any point on the upper surface of the source material 30 and any point in the passages 35a and 35b intersects the inner surface of the upper sheet 22 or the low sheet 21 and since the passages 56a and 56b are tortous, the particle tending to pass through the passages are more effectively arrested.

The boats of Examples 2 and 3 were used to form films of germanium oxide having a thickness of 100A under the same condition as in Example 1 and obtained excellent result as shown in the following Table II.

It was found that these boats are also effectives for the vapour deposition of alloys of the As-Te type. With As-Te alloys, containing more than 50% of Te, although the alloys melt in the boat due to abrupt boiling of As, the particles tends to fly. For this reason, it has been difficult to form films of good quality with the boat of the other type, but when the boat of this invention is used it is possible to readily form vapour deposited films of high quality.

Table II

| Type of the boat | Number of particles on the substrate having an average particle size of 1 to 5μ* | Percentage of good substrate | Number of particles in the boat having a dia. of 1 to 5μ |
|---|---|---|---|
| FIG. 6 | 0.1/substrate | 80 - 100 % | $<2.0 \times 10^4/cm^2$ |
| FIG. 7 | <0.1/substrate | 90 - 100 % | |

Table II-continued

| Type of the boat | Number of particles on the substrate having an average particle size of 1 to 5μ* | Percentage of good substrate | Number of particles in the boat having a dia. of 1 to 5μ |
| --- | --- | --- | --- |

* Mean value obtained by measuring one hundred substrates each having 1.5 cm² area.

As can be noted from the foregoing description the invention provides an improved evaporation boat which is of the closed type, provided with slit shaped vapour passages and constructed such that particles contained in the vapour of the source material do not directly impinge upon the substrate to be vapour deposited. Accordingly, it is possible to form vapour deposited films of high quality.

While the invention has been shown and described in terms of some preferred embodiment thereof it will be clear that many changes and modifications will be obvious to those skilled in the art without departing from the scope of the invention as defined in the appended claims. For example, although the boat was made of molybdenum any high melting point metals and alloys such as tungsten, tantalum, etc, can also be used.

What is claimed is:

1. An evaporation boat comprising superposed upper and lower sheets, said upper sheet having a upwardly convexed central section and a pair of side sections connected to the transverse opposite ends of said central section and bent back toward said central section, said lower sheet having a downwardly convexed central section and a pair of side sections connection to the transverse opposite ends of said downwardly convexed central section and bent inwardly toward said upper sheet and said upper and lower sheets being superposed each other such that said central sections of said upper and lower sheets define a substantially closed chamber for accomodating source material to be evaporated, that slit shaped vapour passages are formed between said upper and lower sheets on the opposite sides of said chamber and that any straight line drawn between any point on the upper surface of the source material contained in said chamber and any point in said passages intersects the inner wall of said upper or lower sheet.

2. The evaporation boat according to claim 1 wherein said bent back side sections of the upper sheet and said side sections of said lower sheet define form V shaped vapour ejecting ports respectively connected to the exit ends of said slit shaped vapour passages.

3. The evaporation boat according to claim 1 wherein the central section of the upper sheet takes the form of an inverted V and that of the lower sheet takes the form of an V.

4. The evaporation boat according to claim 1 wherein said slit shaped vapour passages are formed between the edges at which said side sections of the upper sheet are bent back and the edges at which said side sections of said lower section are bent.

5. The evaporation boat according to claim 1 wherein the central section of said upper sheet takes the form of a upwardly curved semicircle whereas the central section of said lower sheet takes the form of a downwardly curved semicircle.

6. The evaporation boat according to claim 1 wherein said upper sheet further includes intermediate sections which are disposed between the transverse opposite ends of said central section and said bent back side sections respectively, and said intermediate sections are disposed in parallel with said inwardly bent side sections of said lower sheet to define therebetween relatively long slit like vapour passages.

7. The evaporation boat according to claim 5 wherein said upper sheet further includes horizontal intermediate sections between said semicircular central section and said bent back side sections respectively, and said lower sheet further includes horizontal intermediate sections between said semicircular central section and said inwardly bent side sections, said horizontal intermediate sections of said upper and lower sheets defining therebetween relatively long slit like vapour passages.

8. The evaporation boat according to claim 7 wherein each of said horizontal intermediate sections of said upper and lower sheets is provided with a longitudinal rib thus forming tortuous vapour passages.

* * * * *